US009136409B2

(12) United States Patent
Tachikawa

(10) Patent No.: US 9,136,409 B2
(45) Date of Patent: Sep. 15, 2015

(54) OPTICAL DEVICE

(71) Applicant: PANASONIC CORPORATION, Osaka (JP)

(72) Inventor: Keishi Tachikawa, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 132 days.

(21) Appl. No.: 14/073,559

(22) Filed: Nov. 6, 2013

(65) Prior Publication Data

US 2014/0061844 A1  Mar. 6, 2014

Related U.S. Application Data

(63) Continuation of application No. PCT/JP2012/003774, filed on Jun. 8, 2012.

(30) Foreign Application Priority Data

Jun. 9, 2011  (JP) ................................. 2011-128968

(51) Int. Cl.
*H01L 27/146*  (2006.01)
*H01L 31/0352*  (2006.01)

(52) U.S. Cl.
CPC ........ *H01L 31/0352* (2013.01); *H01L 27/1463* (2013.01); *H01L 27/1464* (2013.01); *H01L 27/14689* (2013.01)

(58) Field of Classification Search
CPC ..................... H01L 27/1463; H01L 27/14689; H01L 31/0352
USPC .......................................................... 257/446
See application file for complete search history.

(56) References Cited

U.S. PATENT DOCUMENTS 3,529,217 A  *  9/1970  Van Santen .................... 257/435
5,283,460 A  *  2/1994  Mita .............................. 257/432
(Continued)

FOREIGN PATENT DOCUMENTS

JP       06-029511 A      2/1994
JP       08-255889 A     10/1996
(Continued)

OTHER PUBLICATIONS

International Search Report issued in PCT/JP2012/003774, dated Sep. 4, 2012.

*Primary Examiner* — Matthew W Such
*Assistant Examiner* — Scott Stowe
(74) *Attorney, Agent, or Firm* — McDermott Will & Emery LLP

(57) ABSTRACT

An optical device includes a first region and an isolating layer which are each provided in a semiconductor substrate. The first region configures a photoelectric converter and includes at least an impurity of a first conductivity type. The isolating layer is configured to inhibit passage of electrons. The isolating layer includes a second region which is below the first region and which includes an impurity of a second conductivity type, a third region which surrounds the first region in plan-view thereof and which includes an impurity of the second conductivity type, and a fourth region which surrounds the second region in plan-view thereof and which is connected to the third region. The fourth region is greater in width than a connecting part of the third region which connects the third region to the fourth region.

20 Claims, 8 Drawing Sheets

(56) References Cited

U.S. PATENT DOCUMENTS

| | | | |
|---|---|---|---|
| 5,602,415 A * | 2/1997 | Kubo et al. | 257/443 |
| 5,828,091 A | 10/1998 | Kawai | |
| 6,268,234 B1 | 7/2001 | Yoshida | |
| 6,380,603 B1 | 4/2002 | Takimoto et al. | |
| 6,403,994 B1 | 6/2002 | Wada | |
| 6,765,246 B2 | 7/2004 | Inagaki | |
| 7,423,305 B2 * | 9/2008 | Shinohara et al. | 257/292 |
| 7,776,643 B2 | 8/2010 | Nomura et al. | |
| 2005/0035375 A1 | 2/2005 | Hirata | |
| 2007/0131978 A1 | 6/2007 | Hirata | |
| 2009/0294884 A1 | 12/2009 | Hirata | |
| 2011/0169989 A1 | 7/2011 | Kono et al. | |
| 2012/0104533 A1 | 5/2012 | Hirata | |
| 2013/0214377 A1 | 8/2013 | Hirata | |

FOREIGN PATENT DOCUMENTS

| | | |
|---|---|---|
| JP | 09-266296 A | 10/1997 |
| JP | 2001-177769 A | 6/2001 |
| JP | 2004-165462 A | 6/2004 |
| JP | 2009-252782 A | 10/2009 |

* cited by examiner

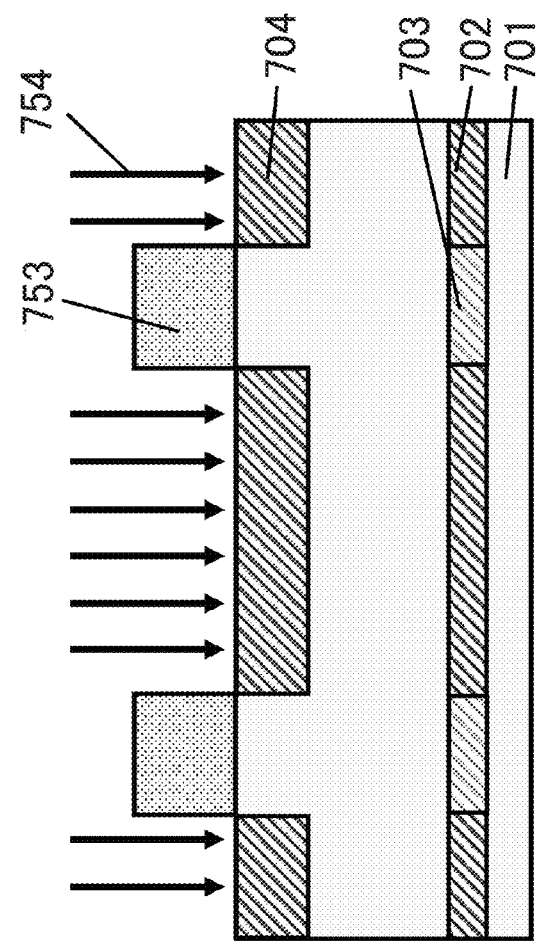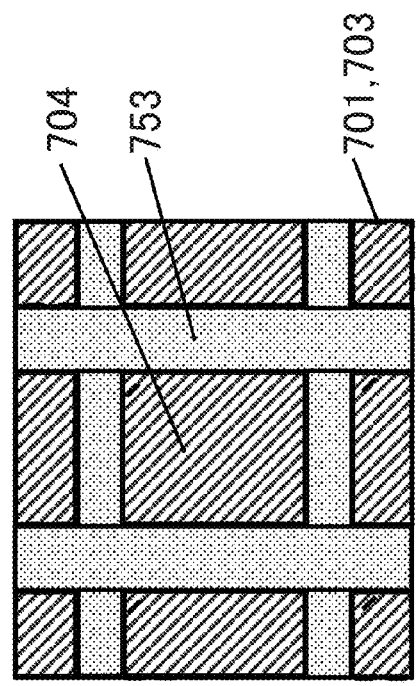
FIG. 5A
FIG. 5B

OPTICAL DEVICE

CROSS REFERENCE TO RELATED APPLICATION

This is a continuation application of PCT Application No. PCT/JP2012/003774 filed Jun. 8, 2012, designating the United States of America, the disclosure of which, including the specification, drawings and claims, is incorporated herein by reference in its entirety.

TECHNICAL FIELD

The present disclosure relates to an optical device and in particular relates to an art concerning an area surrounding a photoelectric converter which is provided in a substrate.

DESCRIPTION OF THE RELATED ART

In recent years, MOS type solid state image devices have undergone rapid progress against a background of increasing energy efficiency and operation speed of systems. In particular, there has been remarkable development in terms of reduction in size of unit pixels through cell miniaturization. In order to respond to the above demands, there is requirement for cell miniaturization to be achieved while also improving a number of output electrons per unit area and per unit of light.

Conventionally, a solid state image device may have a configuration such as proposed in Patent Literature 1. FIG. 8 is a cross-sectional diagram which illustrates the device in Patent Literature 1. As illustrated in FIG. 8, in order to isolate a p-type diffusion layer 902 and an n-type diffusion layer 903, which together configure a photodiode, a p-type diffusion layer 906 is provided at a surface of a semiconductor substrate 901. In order to connect with the p-type diffusion layer 906, an isolating layer 907, which is configured by p-type diffusion layers 907-1, 907-2, 907-3 and 907-4, is provided in a deep portion of the semiconductor substrate 901. The above p-type diffusion layers configuring the isolating layer 907 have impurity concentrations which satisfy a relationship: p-type diffusion layer 907-1<p-type diffusion layer 907-2<p-type diffusion layer 907-3<p-type diffusion layer 907-4. In other words, impurity concentrations are set such that impurity concentration increases in a direction toward the deep portion of the semiconductor substrate 901. By setting impurity concentrations as described above, electrons 911 generated through photoelectric conversion of incident light 910 are inhibited from passing through the isolating layer 907. Furthermore, the solid state image device is configured such that electrons attempting to pass through the isolating layer 907 can be "mopped-up" by an n-type diffusion layer 905 which is provided at the surface of the semiconductor substrate 901 (refer to arrow 912).

Other examples of configuration of a solid state image device are proposed in Patent Literature 2-7.

CITATION LIST

Patent Literature

Patent Literature 1: Japanese Patent Application Publication No. 2009-252782
Patent Literature 2: Japanese Patent Application Publication No. 2004-165462
Patent Literature 3: U.S. Pat. No. 6,268,234
Patent Literature 4: U.S. Pat. No. 6,380,603
Patent Literature 5: U.S. Pat. No. 6,403,994
Patent Literature 6: U.S. Pat. No. 6,765,246
Patent Literature 7: U.S. Pat. No. 7,776,643

SUMMARY

Technical Problem

According to Patent Literature 1, in the photodiode which is configured by the p-type diffusion layer 902 and the n-type diffusion layer 903, the n-type diffusion layer 903 forms a lower part of the photodiode. An n-type diffusion layer is not formed through the deep portion of the semiconductor substrate 901 to configure the photodiode. Consequently, electrons which are generated through photoelectric conversion of light of long wavelengths are able to flow from the lower part of the photodiode into adjacent photodiodes. As a consequence of the above, reduction in color mixing is difficult to achieve.

Also, if the isolating layer 907 is sufficiently wide, formation of an electric potential gradient in a direction toward the deep portion of the semiconductor substrate 901 is difficult, due to impurity concentrations in the p-type diffusion layers configuring the separation layer 907 increasing in the direction of the deep portion. Consequently, electrons overflow toward the surface of the semiconductor substrate as illustrated by arrow 912 in FIG. 8. However, in order to achieve further cell miniaturization the isolating layer is required to have a small width. Consequently, although a portion of the electrons can be ejected toward the surface of the semiconductor substrate, a large portion of the electrons flow into adjacent photodiodes by passing through the isolating layer. In other words, it is difficult to reduce color mixing while also improving a number of output electrons per unit area (enhancing sensitivity).

The present disclosure aims to provide an optical device and a method of producing the same, which reduce color mixing. The present disclosure further aims to provide an optical device and a method of producing the same, which reduce color mixing, while also improving a number of output electrons (enhancing sensitivity).

Solution to Problem

In order to achieve the above aim, in one aspect of the present disclosure an optical device comprises: a first region provided in a semiconductor substrate and configuring a photoelectric converter, the first region including at least an impurity of a first conductivity type; and an isolating layer provided in the semiconductor substrate and configured to inhibit passage of electrons, wherein the isolating layer includes: a second region below the first region and including an impurity of a second conductivity type; a third region surrounding the first region in plan-view thereof and including an impurity of the second conductivity type; and a fourth region surrounding the second region in plan-view thereof and connected to the third region.

Preferably the fourth region is greater in width than a connecting part of the third region which connects the third region to the fourth region.

In another aspect of the present disclosure, a method of producing an optical device comprises steps of: (a) implanting an impurity of a first conductivity type into a semiconductor substrate to form a first region; (b) implanting an impurity of a second conductivity type into the semiconductor substrate to form a second region below the first region; (c) implanting an impurity of the second conductivity type into the semiconductor substrate to form a third region which surrounds the first region in plan-view thereof; and (d) implanting an impurity of the second conductivity type into the semiconductor substrate to form a fourth region directly below the third region, which surrounds the second region in plan-view thereof.

Preferably the fourth region is greater in width than a connecting part of the third region which connects the third region to the fourth region.

In another aspect of the present disclosure, a method of producing an optical device comprises steps of: (a) implanting an impurity of a first conductivity type into a semiconductor substrate to form a first region; (b) implanting an impurity of a second conductivity type into the semiconductor substrate to form a second region below the first region; and (c) implanting an impurity of the second conductivity type into the semiconductor substrate to form a third region which surrounds the first region in plan-view thereof, wherein the impurity of the second conductivity type is implanted in step (b) such that the second region is only formed directly below the first region.

Advantageous Effects of Invention

Color mixing can be reduced through provision of an optical device and a method of production of the same such as described above.

BRIEF DESCRIPTION OF DRAWINGS

FIGS. 5A and 5B each illustrate a cross-sectional view of a step during production of the optical device relating to the embodiment.

DETAILED DESCRIPTION

In the present disclosure, explanation is given using a solid state image device as an example of an optical device. However, the present disclosure is not limited to a solid state image device, and may alternatively be applied to an optical device other than a solid state image device, so long as incompatibility does not arise thereby. Also, the same effects as explained herein could be expected even if recitations of an n-type diffusion layer were to recite a p-type diffusion layer and recitations of a p-type diffusion layer were to recite an n-type diffusion layer. Furthermore, the present disclosure is not limited by values given in the present Description which are merely specific examples thereof.

Embodiment

Figure 1:
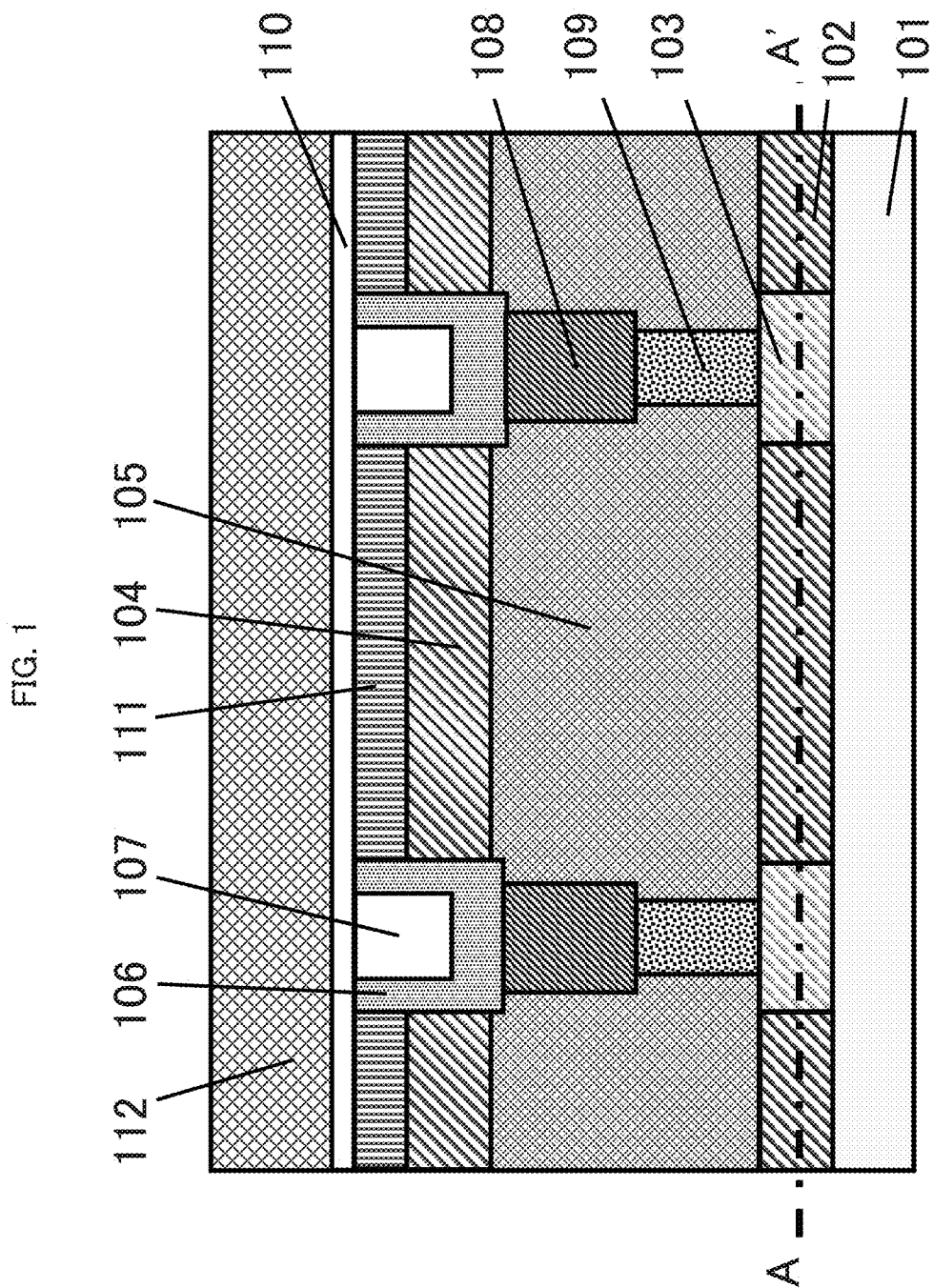
FIG. 1 illustrates a cross-sectional view of an optical device relating to an embodiment of the present disclosure.
Figure 2:
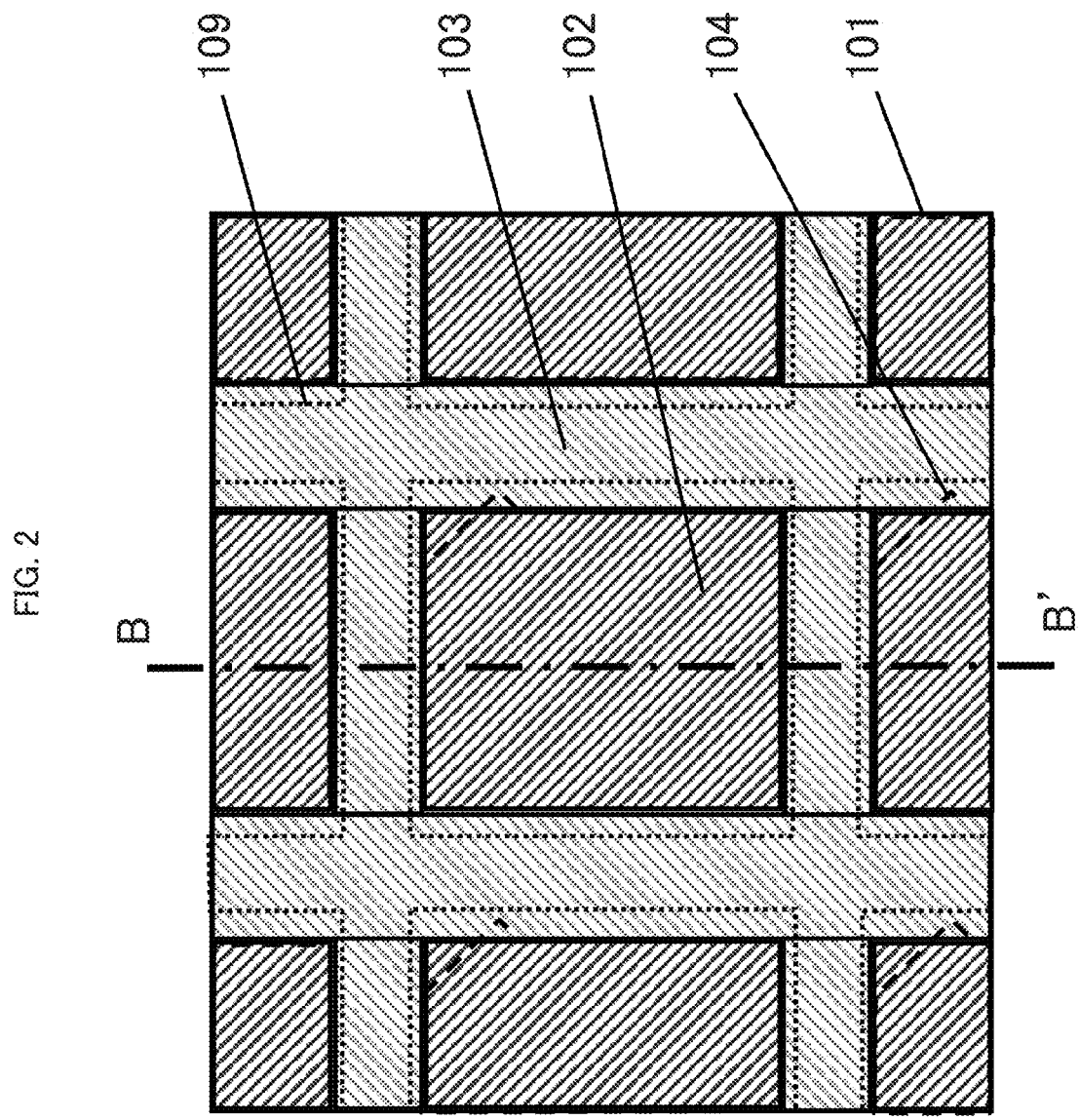
FIG. 2 illustrates a plan-view of the optical device relating to the embodiment.

FIG. 1 illustrates a cross-sectional view of an optical device relating to an embodiment of the present disclosure. FIG. 2 illustrates a plan-view of the optical device, which is a cross-section along a line A-A' illustrated in FIG. 1. The cross-sectional view illustrated in FIG. 1 is a cross-section along a line B-B' illustrated in FIG. 2.

As illustrated in FIG. 1, a $p^+$-type diffusion layer 111, which is a first diffusion layer, an n-type diffusion layer 104, which is directly below the $p^+$-type diffusion layer 111, and an n-type diffusion layer 105, which is directly below the n-type diffusion layer 104, are provided in a semiconductor substrate 101. The $p^+$-type diffusion layer 111, the n-type diffusion layer 104 and the n-type diffusion layer 105 configure a first region. In the present embodiment, the first region is a photoelectric converter which functions as a photodiode. Impurity concentration and depth of the n-type diffusion layer 104 is determined based on linearity, roughness, saturation output and residual image effect. Appropriate values are dependent on cell size, but for example in a small cell of no greater than 1.4 μm preferably impurity concentration of the n-type diffusion layer 104 is at least $1.0E17$ $cm^{-3}$ and preferably the n-type diffusion layer 104 is formed at a depth of less than 300 nm.

A second region is configured by a p-type diffusion layer 102, which is directly below the first region in the semiconductor substrate 101.

A shallow trench isolation (STI) 107, a p-type diffusion layer (upper part) 106, a p-type diffusion layer (middle part) 108 and a p-type diffusion layer (lower part) 109, which together configure a third region, are also provided in the semiconductor substrate 101. The term STI refers to a structure in which a trench is formed in a semiconductor substrate and an insulating film is embedded in the trench. Through provision of the STI, flow of electrons into adjacent photoelectric converters at the surface of the semiconductor substrate can be more reliably inhibited. The third region is provided such as to surround the first region in plan-view thereof. The third region functions as an isolating layer for inhibiting electrons generated in the photoelectric converter from flowing into adjacent photoelectric converters.

A p-type diffusion layer 103, which configures a fourth region, is provided in the semiconductor substrate 101 such as to be connected to the third region. The fourth region surrounds the second region in plan-view thereof. Preferably, the fourth region is in contact with the third region.

Through the above configuration, the photoelectric converter is surrounded by a plurality of diffusion layers (diffusion layers 102, 103, 106, 108 and 109), therefore electrons generated in the photoelectric converter can be inhibited from flowing into adjacent photoelectric converters, and thus color mixing can be sufficiently inhibited.

Preferably the fourth region is greater in width than the p-type diffusion layer 109 in the third region. Through the above, electrons generated in the photoelectric converter can be more reliably inhibited from flowing into adjacent photoelectric converters in the deep portion of the semiconductor substrate 101.

Preferably p-type impurity concentration of the fourth region is lower than p-type impurity concentration of the second region. Through the above, electrons generated in the photoelectric converter can be more reliably inhibited from flowing into adjacent photoelectric converters in the deep portion of the semiconductor substrate 101.

Preferably impurity concentration of the p-type diffusion layer 103 is lower than impurity concentration of each of the p-type diffusion layers 106, 108 and 109. Through the above, when electrons generated in the photoelectric converter reach the isolating layer, the electrons can be ejected from a rear surface of the semiconductor substrate 101, and thus color mixing can be inhibited. For example, preferably impurity concentration of the p-type diffusion layer 103 is in a range of $5.0E14$ cm$^{-3}$ to $5.0E16$ cm$^{-3}$, impurity concentration of the p-type diffusion layer 106 is in a range of $1.0E17$ cm$^{-3}$ to $1.0E19$ cm$^{-3}$, impurity concentration of the p-type diffusion layer 108 is in a range of $5.0E16$ cm$^{-3}$ to $1.0E18$ cm$^{-3}$, and impurity concentration of the p-type diffusion layer 109 is in a range of $1.0E16$ cm$^{-3}$ to $5.0E17$ cm$^{-3}$.

Also, preferably impurity concentration of each of the p-type diffusion layers 106, 108 and 109 is higher than impurity concentration of the p-type diffusion layer 102. Through setting of impurity concentrations such as described above, punch through between the n-type diffusion layers 104 and 105 in the photoelectric converter and the substrate 101 can be prevented, thus saturated output can be maintained and a high dynamic range can be achieved. For example, preferably impurity concentration of the p-type diffusion layer 102 is in a range of $5.0E15$ cm$^{-3}$ to $1.0E17$ cm$^{-3}$.

Also, preferably width of the p-type diffusion layer 108 is less than width of the p-type diffusion layer 106 and preferably width of the p-type diffusion layer 109 is less than width of the p-type diffusion layer 108. Through the above, electrons can be effectively generated in the deep portion of the photoelectric converter even when diffraction of long wavelength light occurs. Consequently, a number of electrons per unit area can be increased.

Preferably impurity concentration of the p-type diffusion layer 108 is lower than impurity concentration of the p-type diffusion layer 106, and preferably impurity concentration of the p-type diffusion layer 109 is lower than impurity concentration of the p-type diffusion layer 108. Through the above, when electrons generated in the photoelectric converter reach the isolating layer, the electrons can be ejected from a rear surface of the semiconductor substrate 101, and thus color mixing can be inhibited.

Preferably the third region is no greater than 0.5 µm in width. For example, preferably width of the p-type diffusion layer 109 is set in a range of 0.1 µm to 0.5 µm. The above is particularly effective for providing an optical device in which color mixing can be inhibited, even when a number of output electrons per unit area is increased. The above is also particularly effective in inhibiting color mixing due to light of longer wavelengths than green light.

Preferably the fourth region is no greater than 0.7 µm in width. For example, preferably width of the p-type diffusion layer 103 is set in a range of 0.1 µm to 0.7 µm. The above is particularly effective for providing an optical device in which color mixing can be inhibited, even when a number of output electrons per unit area is increased.

Preferably cell size is no greater than 1.4 µm, and in particular preferably the first region is no greater than 1.4 µm in width. The above is particularly effective for providing an optical device in which color mixing can be inhibited, even when a number of output electrons per unit area is increased.

In FIG. 1, each of the regions is illustrated above the semiconductor substrate 101 in order to facilitate understanding of the regions. However, in an actual configuration, the first region, the second region, the third region, the fourth region and the like are each formed in the semiconductor substrate 101.

Also, preferably an insulating film 110, such as an oxide film, and an inter-layer insulating film 112 are formed above the semiconductor substrate 101, and wiring, wave guides and the like are formed therein. A wave guide functions as a pathway for incident light and can be implemented for example through a region having a different refractive index to other regions.

With regards to the third region, preferably a lowermost part of the p-type diffusion layer 106 is lower than a lowermost part of the p-type diffusion layer 111 and the n-type diffusion layer 104.

The n-type diffusion layer 105 functions as a diffusion layer for generating electrons in the deep portion of the semiconductor substrate 101, using light of wavelengths greater than 500 nm (wavelengths longer than green light).

As is clear from FIG. 2, preferably the fourth region is provided in a grid pattern such as to surround the third region in contact therewith. In other words, a plurality of photoelectric converters (first regions) are provided in an array so as to configure a plurality of pixel units. In the present embodiment, a single photoelectric converter (first region) and a part of the third region surrounding the photoelectric converter are referred to as a cell.

Furthermore, preferably a first transistor for readout of electrons from the photoelectric converter, a voltage converter for converting electrons to an electrical voltage, a second transistor for outputting an electron signal, and a third transistor for ejecting electrons from the voltage converter are each provided on the surface of the semiconductor substrate 101.

Voltage converters, second transistors and third transistors may each be provided in a one-to-one correspondence with cells (pixels), however from a point of view of miniaturization, preferably each voltage converter, second transistor and third transistor is provided with respect to a plurality of pixels.

Through the embodiment of the present disclosure described above, an optical device can be provided which reduces color mixing.

[Mechanism]

Figure 3:
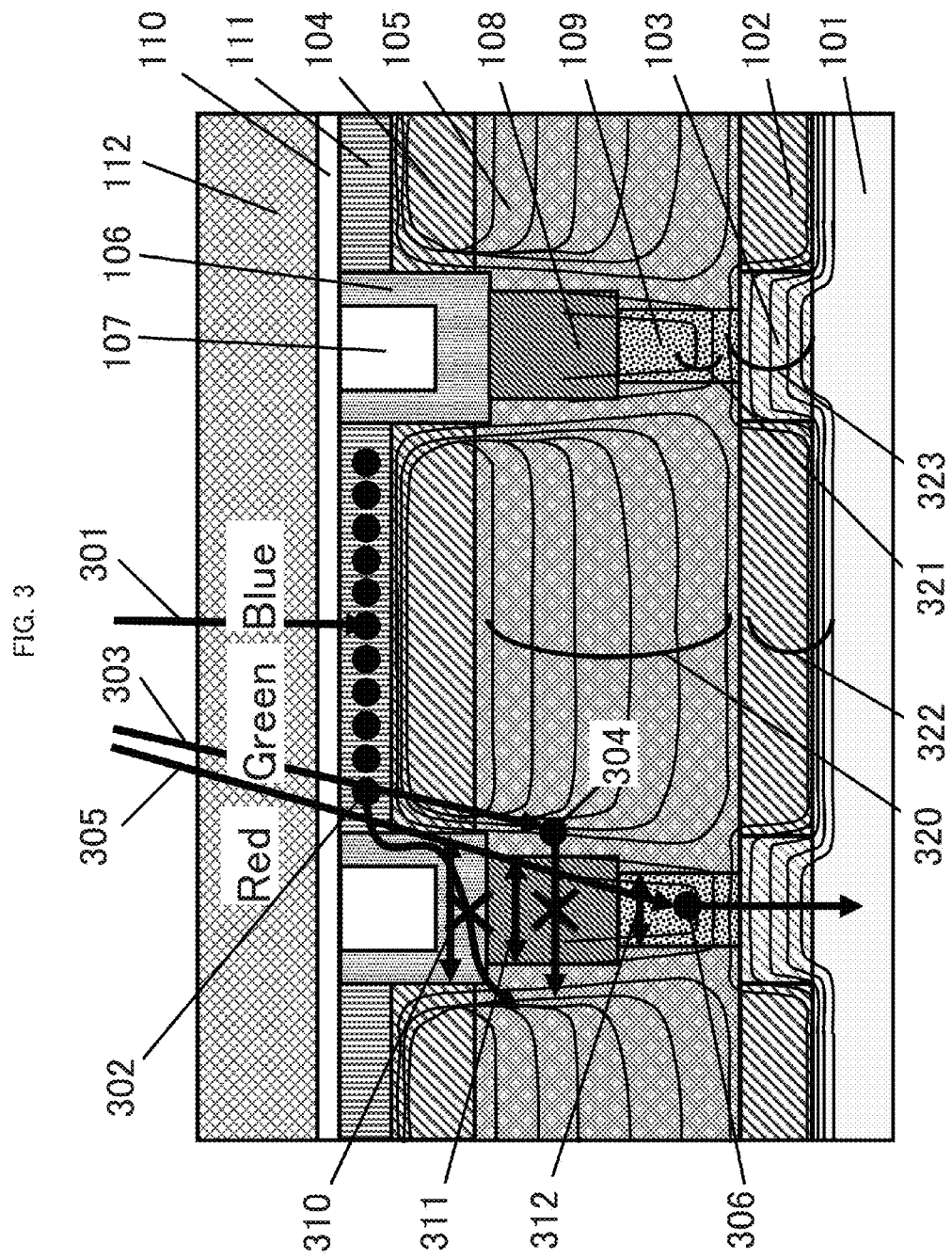
FIG. 3 is provided for explaining a mechanism of the optical device relating to the embodiment.

The following explains, with reference to FIG. 3, a mechanism for reducing color mixing, while also enhancing sensitivity. FIG. 3 is a cross-section along the line B-B' illustrated in FIG. 2 and is provided for explaining a mechanism for light collection and color mixing inhibition. Elements illustrated in FIG. 3 using the same reference signs as in FIGS. 1 and 2 are the same as in FIGS. 1 and 2, therefore explanation thereof is omitted.

First, suppose that blue light 301 is incident on the photoelectric converter. The blue light 301 has a short wavelength in a range of 400 nm to 500 nm and is incident on the photoelectric converter with almost no diffraction. Light attenuates exponentially as it is absorbed by the semiconductor substrate 101, thus a largest number of electrons 302 are generated close to the surface of the semiconductor substrate 101. Therefore, flow of the electrons 302 into adjacent photoelectric converters can be inhibited by appropriate setting of width 310 and impurity concentration of the p-type diffusion layer 106. Consequently, collection of light in the n-type diffusion layer 104 can be increased and sensitivity can be enhanced. Furthermore, a saturation electron number can be maximized through width and impurity concentration of the n-type diffusion layer 104, regardless of width 310 and impurity concentration of the p-type diffusion layer 106.

Next, suppose that green light 303 is incident on the photoelectric converter. The green light has a medium wavelength in a range of 500 nm to 600 nm and diffraction thereof occurs, thus electrons 304 may also be generated at a peripheral edge of the n-type diffusion layer 105. However, flow of the electrons 304 into adjacent photoelectric converters can be inhibited even by setting width 311 of the p-type diffusion layer 108 lower than width 310 of the p-type diffusion layer 106. Furthermore, by setting width 311 of the p-type diffusion layer 108 as a low value, collection of light can be increased in the n-type diffusion layers 104 and 105 in the deep portion of the semiconductor substrate 101, and sensitivity can be enhanced. When electrons generated through photoelectric conversion accumulate in the n-type diffusion layers 104 and 105, an electric potential gradient 320 arises in the n-type diffusion layers 104 and 105, which extends to boundaries with the p-type diffusion layers 106, 108 and 109. Consequently, a degree of collection in the n-type diffusion layers 104 and 105 is increased for the electrons 302 and 304, which are generated due to the blue light and the green light respectively, and thus sensitivity is enhanced.

Next, suppose that red light 305 is incident on the photoelectric converter. The red light 305 has a long wavelength of at least 600 nm and diffraction thereof occurs, thus electrons 306 may be generated in the p-type diffusion layer 109. Herein, by setting impurity densities of p-type diffusion layers which configure the isolating layer so as to satisfy a relationship: p-type diffusion layer 106≥p-type diffusion layer 108≥p-type diffusion layer 109, an electric potential gradient 321 is formed in the p-type diffusion layer 109 in a depth direction of the semiconductor substrate 101, due to application of a substrate voltage to a bottom part of the semiconductor substrate 101. Furthermore, by setting impurity concentration of the p-type diffusion layer 103 as no greater than impurity concentration of the p-type diffusion layer 102 and also as no greater than impurity concentration of the p-type diffusion layer 109, an electric potential gradient 323 is formed in the p-type diffusion layer 103, without an electric potential gradient 322 being formed in the p-type diffusion layer 102. Consequently, the electrons 306, which are generated in the p-type diffusion layer 109 due to the red light 305, can move along the electric potential gradient 321 to reach the p-type diffusion layer 103, and subsequently can move along the electric potential gradient 323 to be mopped-up at the rear surface of the semiconductor substrate 101. As an effect of the above, the electrons 306 are inhibited from flowing into adjacent photoelectric converters. Through the above, a significant improvement can be achieved in reducing color mixing due to red light.

The p-type diffusion layer 109 and the p-type diffusion layer 103 are in contact with one another, and therefore the n-type diffusion layer 105 can be completely isolated from the n-type diffusion layer 105 in adjacent photoelectric converters. Also, by setting impurity concentration of the p-type diffusion layer 103 as no greater than impurity concentration of each the p-type diffusion layers 102 and 109, the electric potential gradients 321 and 323 in the p-type diffusion layers 109 and 103 respectively can be formed in the depth direction of the semiconductor substrate 101.

Furthermore, by not forming the electric potential gradient 322 in the p-type diffusion layer 102, a degree of collection of electrons by the electric potential gradient 304 in the n-type diffusion layer 104 is increased with regards to green light and red light which proceeds in a constant direction without being diffracted, and thus sensitivity can be enhanced. Also, isolation between the n-type diffusion layer 104 and a region in the semiconductor substrate 101 which is deeper than the p-type diffusion layer 102 can be increased, thus achieving a high dynamic range through prevention of punch through and maintenance of a high saturation electron number.

In the present embodiment, sensitivity can be enhanced if color mixing is reduced. Therefore, configuration is important with regards to the p-type diffusion layers 102 and 103, which have an effect of ejecting electrons to a rear surface of the semiconductor substrate 101. In the present embodiment the isolating layer is configured by separate diffusion layers 106, 108 and 109, but alternatively the isolating layer may be configured as a single layer. Furthermore, it is not essential that the isolating layer (diffusion layers 106, 108 and 109) narrows in the depth direction of the semiconductor substrate 101 or that impurity concentration of the isolating layer decreases in the depth direction.

In the present embodiment, the photoelectric converter is configured by two n-type diffusion layers 104 and 105, but alternatively the photoelectric converter may be configured by a single n-type diffusion layer. The above is due to the n-type diffusion layer 104, which is formed toward a surface side of the semiconductor substrate 101, also being able to form a sufficient electric potential gradient when electrons accumulate.

In the present embodiment, the fourth region is configured by the p-type diffusion layer 103, but alternatively the fourth region may be configured by an n-type diffusion layer 103. The same effects can be achieved even if the fourth region is configured by the n-type diffusion layer 103. Furthermore, in a configuration in which the semiconductor substrate 101 is an n-type semiconductor substrate, alternatively an n-type diffusion layer may not be formed in the fourth region. In other words, in the above configuration impurity concentration of an n-type impurity in a fifth region, which is provided directly below the second region and the fourth region, is approximately equal to impurity concentration of the fourth region. In the above case, preferably a p-type impurity used in formation of the p-type diffusion layer 102 is not implanted in the fourth region.

[Method of Production]

The following explains a method of producing the optical device in the embodiment of the present disclosure. FIGS. 4A-4B, 5A-5B, 6A-6B and 7 illustrate cross-sectional views during steps of production.

Figures 4A, 4B:
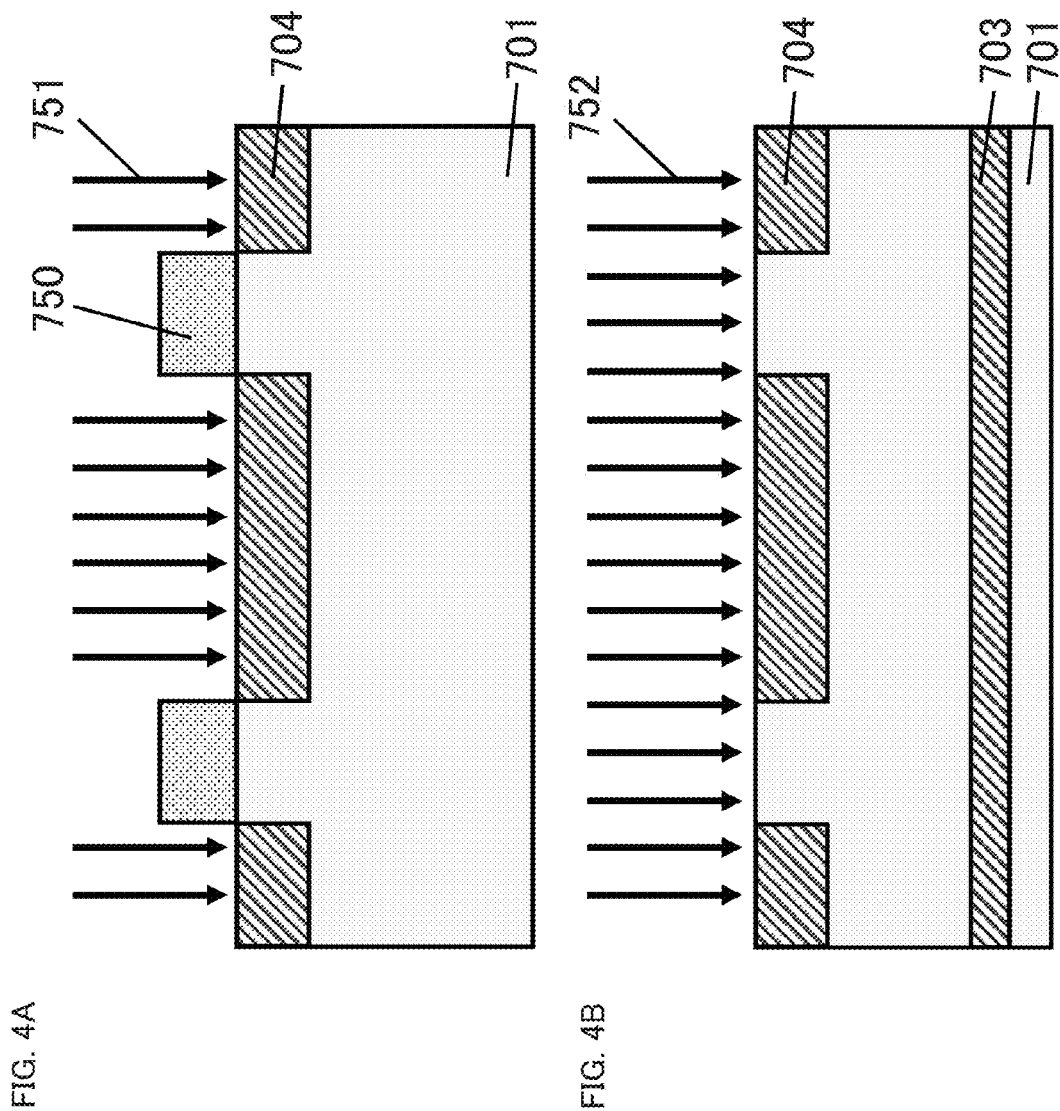
FIGS. 4A and 4B each illustrate a cross-sectional view of a step during production of the optical device relating to the embodiment.

As illustrated in FIG. 4A, first a photoresist mask 750 is formed on a surface of a semiconductor substrate 701. Next, an n-type diffusion layer 704 is formed by ion implantation 751 of an n-type impurity such as arsenic or phosphorus. Preferably, the ion implantation is performed using an acceleration energy of no greater than 400 KeV in the case of arsenic and no greater than 200 KeV in the case of phosphorus.

As illustrated in FIG. 4B, next a p-type diffusion layer 703 is formed throughout an entire surface region of the semiconductor substrate 701 by ion implantation 752 of a p-type impurity, such as boron, across the entire semiconductor substrate 701. In a case in which an ion implanter of a type which controls channeling is used, preferably ion implantation of boron is performed using an acceleration energy in a range of 1200 KeV to 3000 KeV. In a case in which an ion implanter of a type which actively uses channeling is used, preferably ion implantation of boron is performed using an acceleration energy in a range of 600 KeV to 2000 KeV. Furthermore, during ion implantation of boron, preferably a dose is in a range of $5.0E10$ cm$^{-2}$ to $1.0E12$ cm$^{-2}$.

As illustrated in FIG. 5A, next a photoresist mask 753 of at least 2000 nm in thickness is formed on the surface of the semiconductor substrate 701. During the above, when the semiconductor substrate 701 is viewed from above as illustrated in FIG. 5B, the photoresist mask 753 is formed in a grid pattern, with island shapes in gaps between the grid corresponding to regions in which resist is not formed. The grid pattern during the above has dimensions in a range of 0.1 μm to 0.7 μm. Next, a p-type diffusion layer 702 is formed by implantation of a p-type impurity, such as boron, using the same acceleration energy as used when forming the p-type diffusion layer 703. When implanting the p-type impurity to form the p-type diffusion layer 702, a dose is determined such that when added to the dose used in formation of the p-type diffusion layer 703, a total dose is in a range of 1.0E11 cm$^{-2}$ to 2.0E12 cm$^{-2}$. As illustrated in FIGS. 5A and 5B, p-type impurity concentration of the p-type diffusion layer 702 can be set as greater than p-type impurity concentration of the p-type diffusion layer 703 by setting doses as described above.

Figures 6A, 6B:
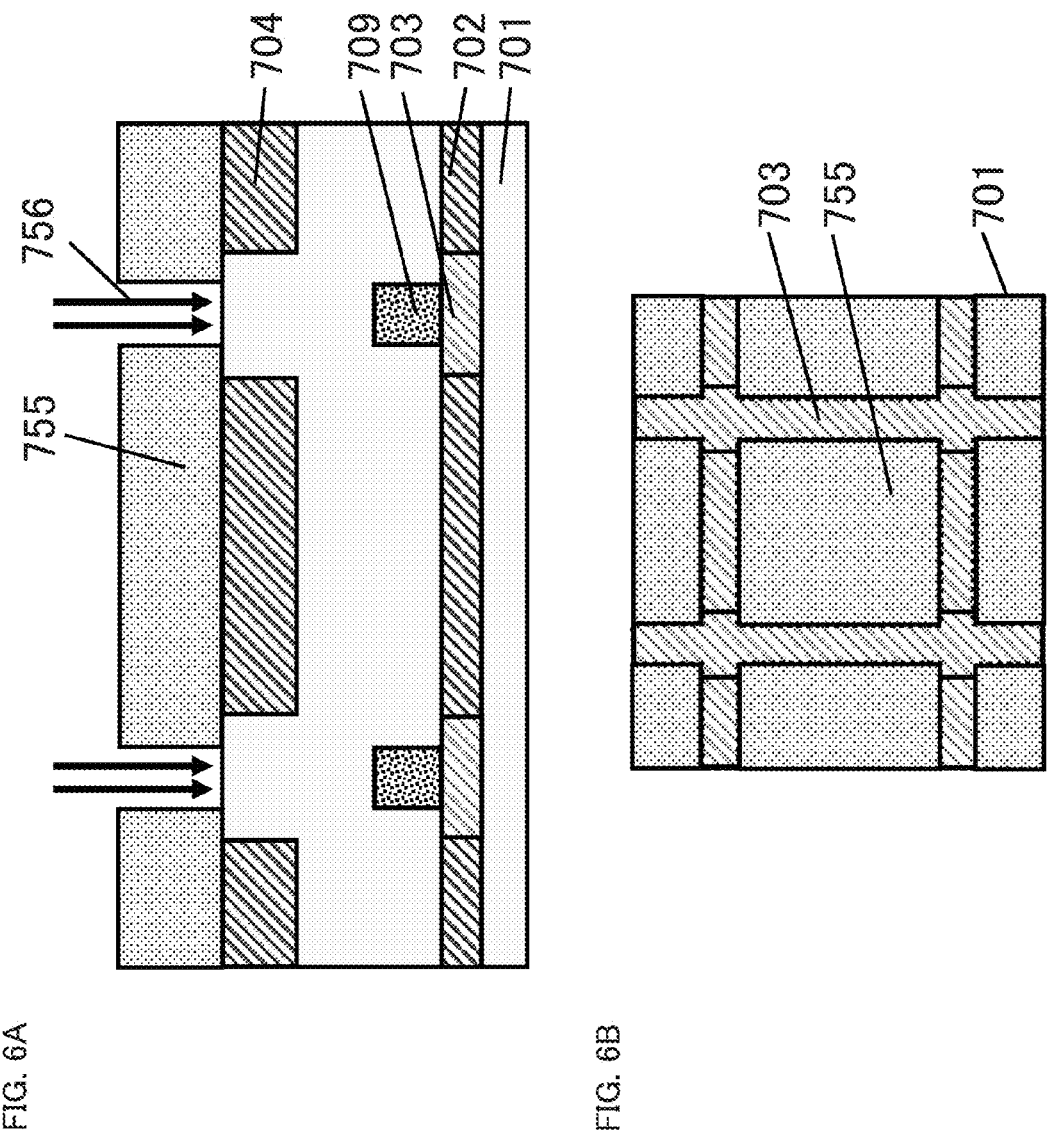
FIGS. 6A and 6B each illustrate a cross-sectional view of a step during production of the optical device relating to the embodiment.

As illustrated in FIG. 6A, next a photoresist mask 755 of at least 2000 nm in thickness is formed on the surface of the semiconductor substrate 701. During the above, when the semiconductor substrate 701 is viewed from above as illustrated in FIG. 6B, the photoresist mask 755 is formed in an island pattern, with a grid pattern around the islands corresponding to regions in which resist is not formed. The grid pattern during the above, which corresponds to regions in which resist is not formed, has dimensions in a range of 0.1 μm to 0.5 μm. Next, a p-type diffusion layer 709 is formed by ion implantation 756 of a p-type impurity, such as boron, using an acceleration energy which in no greater than used when forming the p-type diffusion layer 703. A dose of the p-type impurity during the ion implantation is set in a range of 2.0E11 cm$^{-2}$ to 1.0E13 cm$^{-2}$.

Figure 7:
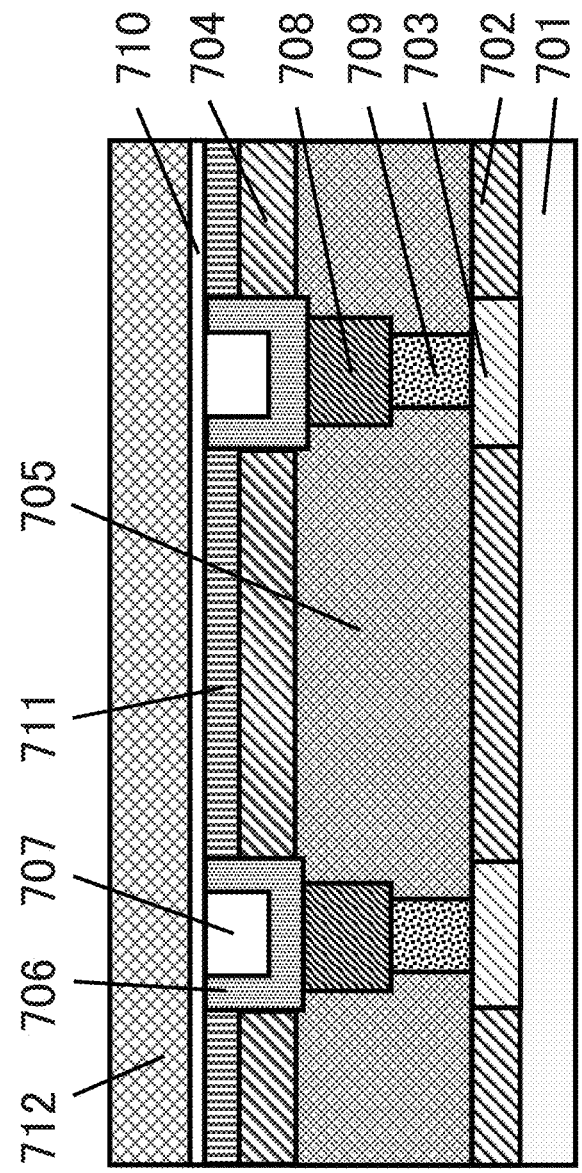
FIG. 7 illustrates a cross-sectional view of a step during production of the optical device relating to the embodiment.
Figure 8:
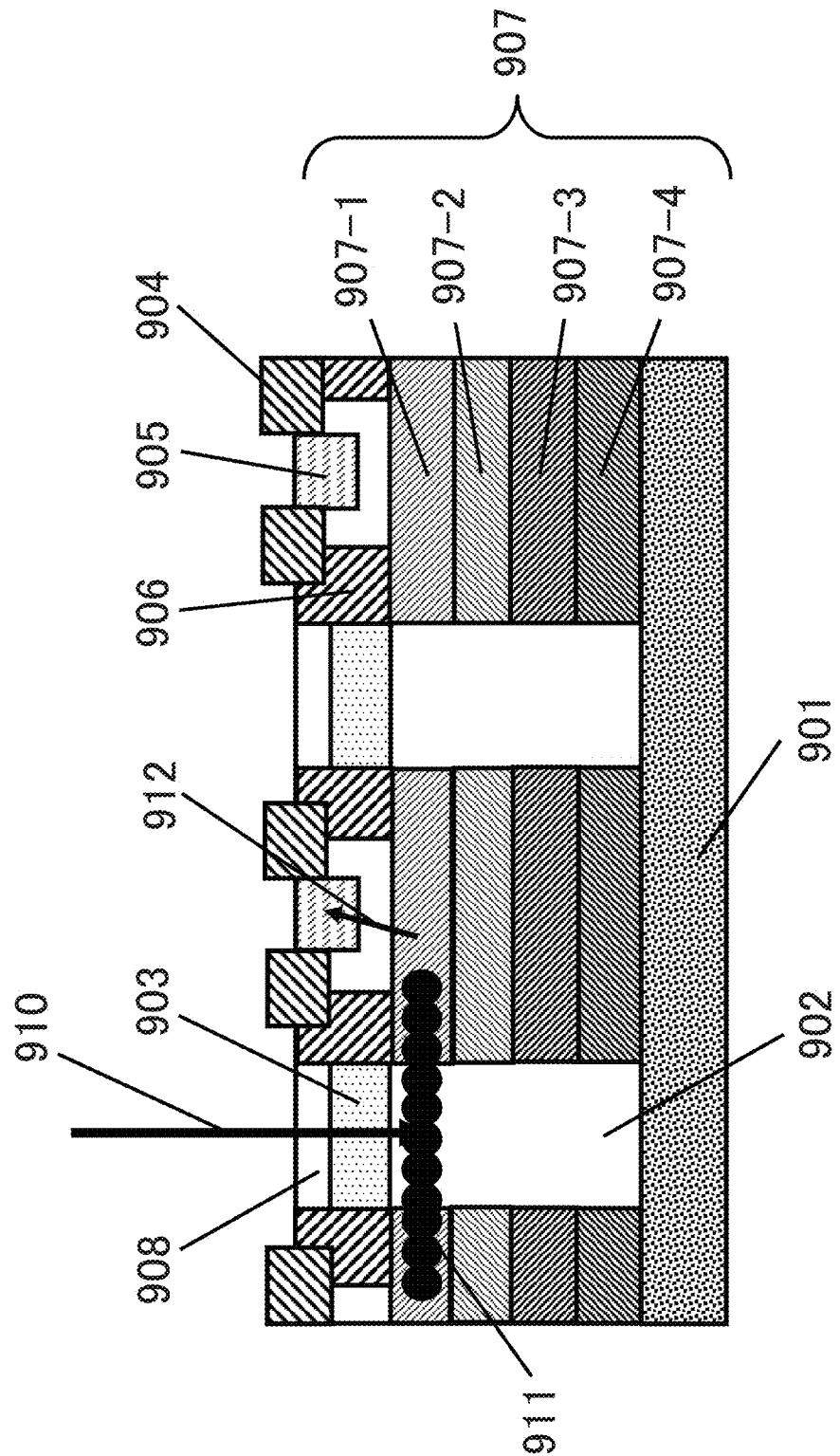
FIG. 8 is provided for explaining the conventional art.

Next, as illustrated in FIG. 7, a p-type diffusion layer 708 and a p-type diffusion layer 706 are formed by ion implantation of a p-type impurity, such as boron, either using the photoresist mask 755 used in formation of the p-type diffusion layer 709, or by using a new photoresist mask in which a grid pattern, corresponding to regions in which no photoresist is formed, is wider than the grid pattern in the photoresist mask 755. Subsequently, an STI 707 is formed by forming a trench in the p-type diffusion layer 706 and embedding an insulating film in the trench. Next, a p$^+$-type diffusion layer 711 is formed by implantation of a p-type impurity, such as boron, at a surface of the n-type diffusion layer 704. Subsequently, an oxide film 710 and an interlayer film 712 are formed over an upper portion of the semiconductor substrate 701, and wiring, wave guides and the like are formed therein, thus forming the optical device.

Through the present method of production, a photoelectric converter, which is configured by the diffusion layers 711, 704 and 705, is surrounded by a plurality of diffusion layers (diffusion layers 702, 703, 706, 708 and 709). Therefore, electrons generated in the photoelectric converter can be inhibited from flowing into adjacent photoelectric converters, and thus color mixing can be sufficiently inhibited.

In the step illustrated in FIG. 4B, ion implantation of the p-type impurity, such as boron, is performed for the entire semiconductor substrate, but alternatively ion implantation may be performed for all regions of the semiconductor substrate other than the fourth region. In a case such as described above, preferably ion implantation of the p-type impurity in the step corresponding to FIG. 5A is performed such that impurity concentration of a region (corresponding to the p-type diffusion layer 703) which is the fourth region is lower than impurity concentration of the second region.

Furthermore, in the step illustrated in FIG. 4B, in a case in which ion implantation of the p-type impurity is performed for all regions of the semiconductor substrate other than the fourth region, ion implantation of an n-type impurity in the region which forms the fourth region may be performed in the step corresponding to FIG. 5A. In a case in which the n-type impurity which is implanted is arsenic, preferably acceleration energy is in a range of 2000 KeV to 6000 KeV, and in a case in which the n-type impurity is phosphorus, preferably acceleration energy is in a range of 1500 KeV to 4000 KeV. When the n-type impurity which is implanted is arsenic, preferably a dose is in a range of 1.0E11 cm$^{-2}$ to 2.0E12 cm$^{-2}$. Alternatively, ion implantation may not be performed. In the above situation, n-type impurity concentration of the region which forms the fourth region and n-type impurity concentration directly below the second region are the same if the semiconductor substrate is an n-type semiconductor substrate. Even in a configuration such as described above, color mixing can be sufficiently inhibited.

INDUSTRIAL APPLICABILITY

As explained above, through the present disclose an optical device can be produced which reduces color mixing. Furthermore, through the present disclosure an optical device can be produced which reduces color mixing, while also improving an output electron number per unit area (enhancing sensitivity).

REFERENCE SIGNS LIST 101 semiconductor substrate
102 p-type diffusion layer
103 p-type diffusion layer
104, 105 n-type diffusion layer
106, 108, 109 p-type diffusion layer
107 STI
110 oxide film
111 p$^+$-type diffusion layer
112 interlayer film

The invention claimed is:

1. An optical device comprising:
a first region provided in a semiconductor substrate and configuring a photoelectric converter, the first region including at least an impurity of a first conductivity type; and
an isolating layer provided in the semiconductor substrate and configured to inhibit passage of electrons, wherein the isolating layer includes:
a second region below the first region and including an impurity of a second conductivity type;
a third region surrounding the first region in plan-view thereof and including an impurity of the second conductivity type; and
a fourth region surrounding the second region in plan-view thereof and connected to the third region, and
the fourth region is greater in width than a connecting part of the third region which connects the third region to the fourth region.

2. The optical device of claim 1, wherein
the fourth region includes an impurity of the second conductivity type.

3. The optical device of claim 2, wherein
the impurity of the second conductivity type included in the fourth region has a lower concentration than the impurity of the second conductivity type included in the second region.

4. The optical device of claim 2, wherein
the impurity of the second conductivity type included in the fourth region has a lower concentration than the impurity of the second conductivity type included in the third region.

5. The optical device of claim 2, wherein
the first region includes a first diffusion layer, a second diffusion layer and a third diffusion layer in respective order from an upper surface thereof,
the first diffusion layer includes an impurity of the second conductivity type, and
the second diffusion layer and the third diffusion layer each include an impurity of the first conductivity type.

6. The optical device of claim 2, wherein
a shallow trench isolation is provided in a surface region of the third region.

7. The optical device of claim 2, wherein
the first region and the third region are each connected to a surface of the fourth region.

8. The optical device of claim 2, wherein
the third region includes an upper part and a middle part which is located lower than the upper part, and
the upper part is greater in width than the middle part.

9. The optical device of claim 8, wherein
in the third region the impurity of the second conductivity type has a greater concentration in the upper part than in the middle part.

10. The optical device of claim 8, wherein
the third region further includes a lower part which is located lower than the middle part, and
the middle part is greater in width than the lower part.

11. The optical device of claim 10, wherein
in the third region the impurity of the second conductivity type has a greater concentration in the middle part than in the lower part.

12. The optical device of claim 1, wherein
the fourth region includes an impurity of the first conductivity type.

13. The optical device of claim 12, wherein
the semiconductor substrate is provided with a fifth region below the third region and the fourth region,
the fifth region includes an impurity of the first conductivity type, and
the impurity of the first conductivity type included in the fourth region has an equal concentration to the impurity of the first conductivity type included in the fifth region.

14. The optical device of claim 1, wherein
the fourth region is no greater than 0.7 μm in width.

15. The optical device of claim 1, wherein
the first region is no greater than 1.4 μm in width.

16. The optical device of claim 1, wherein
the semiconductor substrate is provided with a first transistor which is configured to perform readout of electrons from the photoelectric converter.

17. The optical device of claim 1, wherein
a portion of electrons generated by the photoelectric converter flow to a surface of the semiconductor substrate by passing through the third region and the fourth region.

18. The optical device of claim 1, wherein
the semiconductor substrate is provided with a plurality of pixel units arranged in an array and a plurality of second transistors, provided in a one-to-one ratio to the pixel units, which are each configured to output an electron signal.

19. The optical device of claim 1, wherein
the impurity of the first conductivity type is an n-type impurity, and
each of the impurities of the second conductivity type is a p-type impurity.

20. An optical device, comprising:
a first region provided in a semiconductor substrate and configuring a photoelectric converter, the first region including at least an impurity of a first conductivity type; and
an isolating layer provided in the semiconductor substrate and configured to inhibit passage of electrons, wherein the isolating layer includes:
a second region below the first region and including an impurity of a second conductivity type;
a third region surrounding the first region in plan-view thereof and including an impurity of the second conductivity type; and
a fourth region surrounding the second region in plan-view thereof and connected to the third region.

* * * * *